US006268255B1

(12) United States Patent
Besser et al.

(10) Patent No.: US 6,268,255 B1
(45) Date of Patent: Jul. 31, 2001

(54) METHOD OF FORMING A SEMICONDUCTOR DEVICE WITH METAL SILICIDE REGIONS

(75) Inventors: Paul R. Besser, Austin, TX (US); Christian Zistl, Dresden (DE); Nicholas J. Kepler, Saratoga, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/479,402

(22) Filed: Jan. 6, 2000

(51) Int. Cl.[7] .......................... H01L 21/336; H01L 21/44
(52) U.S. Cl. .......................... 438/303; 438/305; 438/682; 438/664
(58) Field of Search ...................................... 438/199, 303, 438/305, 525, 649, 664, 682, 592, 683, 301

(56) References Cited

U.S. PATENT DOCUMENTS

| | | | |
|---|---|---|---|
| 4,897,368 | 1/1990 | Kobushi et al. | 437/200 |
| 5,034,348 | 7/1991 | Hartswick et al. | 437/200 |
| 5,447,875 | 9/1995 | Moslehi | 437/41 |
| 5,981,320 | * 11/1999 | Lee | 438/199 |
| 6,025,241 | * 2/2000 | Lin et al. | 438/303 |
| 6,025,620 | * 2/2000 | Kimura et al. | 257/296 |
| 6,096,639 | * 8/2000 | Dawson et al. | 438/649 |
| 6,107,194 | * 8/2000 | Hodges et al. | 438/649 |
| 6,133,124 | * 10/2000 | Horstmann et al. | 438/525 |
| 6,165,903 | * 12/2000 | Besser et al. | 438/682 |
| 6,207,563 | * 3/2001 | Wieczorck et al. | 438/664 |

OTHER PUBLICATIONS

Goto et al., "Optimization of Salicide Processes for sub 0.1–μm CMOS Devices," *1994 Symposium on VLSI Technology Digest of Technical Papers*, pp. 119–120, Apr. 1994.
Sohn et al., "High Thermal Stability and Low Junction Leakage Current of Ti Capped Co Salicide and its Feasibility for High Thermal Budget CMOS Devices," Mar. 1998.
Goto et al., "A New Leakage Mechanism of Co Salicide and Optimized Process Conditions," *IEEE Transactions on Electron Devices*, vol. 46, No. 1, p. 117, Jan. 1999.

* cited by examiner

Primary Examiner—John F. Niebling
Assistant Examiner—Walter L. Lindsay, Jr.
(74) Attorney, Agent, or Firm—Williams, Morgan & Amerson, P.C.

(57) ABSTRACT

The present invention is directed to a method of making a semiconductor device. In one illustrative embodiment, the method comprises forming a first layer comprised of polysilicon, forming a second layer comprised of a refractory metal above the layer of polysilicon and converting at least a portion of the second layer to a first metal silicide. The method further comprises forming an anti-reflective coating layer above the layer of refractory metal or the first metal silicide layer, and patterning the first metal silicide layer and the layer of polysilicon to define a gate stack comprised of a first metal silicide region and a layer of polysilicon, forming a plurality of source/drain regions in the substrate, forming a third layer comprised of a refractory metal above at least the gate stack and the source/drain regions, and converting at least a portion of the third layer to a second metal silicide region.

56 Claims, 3 Drawing Sheets

METHOD OF FORMING A SEMICONDUCTOR DEVICE WITH METAL SILICIDE REGIONS

CROSS-REFERENCE TO RELATED APPLICATIONS

The present invention is related to our co-pending application, entitled "Semiconductor Device Having Enhanced Electrical Characteristics and Method of Making Same," Ser. No. 09/479399, which is hereby incorporated by reference in its entirety.

BACKGROUND OF THE INVENTION

1. Field of the Invention

The present invention is generally directed to the field of semiconductor processing, and, more particularly, to a method of forming metal silicide regions on a semiconductor device, and a device comprising the same.

2. Description of the Related Art

Figure 1:
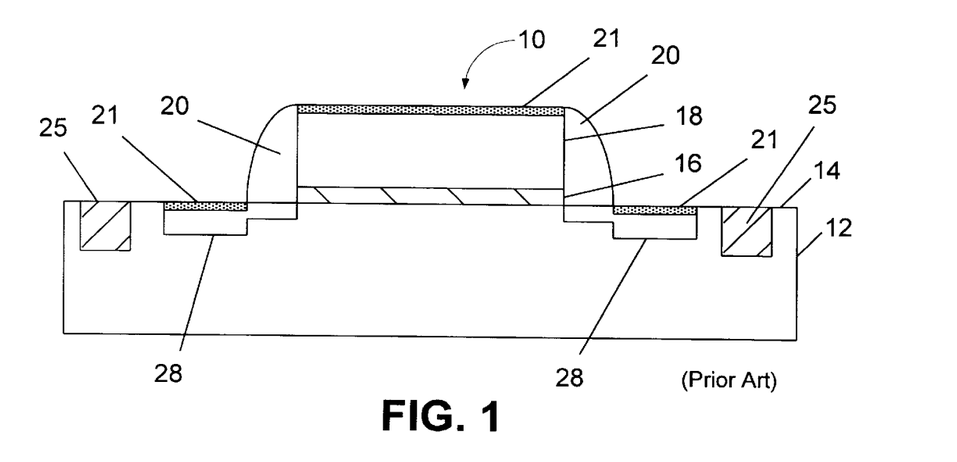
FIG. 1 is a cross-sectional view of an illustrative prior art field effect transistor.

There is a constant drive within the semiconductor industry to increase the operating speed of integrated circuit devices, e.g., microprocessors, memory devices, etc. This drive is fueled by consumer demands for computers and electronic devices that operate at increasingly greater speeds. By way of background, FIG. 1 depicts an illustrative NMOS field effect transistor 10 formed above a surface 14 of a semiconducting substrate 12 between trench isolation regions 25. The transistor 10 is comprised of a gate dielectric 16, a gate electrode 18, a plurality of sidewall spacers 20 and multiple source/drain regions 28. The transistor 10 is further comprised of metal silicide contacts 21 formed on the source/drain regions 28 and on the gate electrode 18.

The aforementioned demand for increased operating speed of integrated circuit devices has resulted in a continual reduction in the size of semiconductor devices, e.g., transistors. That is, the size of many components of a typical field effect transistor, e.g., channel length, source/drain junction depths, gate dielectric thickness, etc., are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

As the channel length has been reduced to obtain the desired switching characteristic, the length of the gate electrode has also been reduced. Since the gate electrode may only be electrically connected at one end, the electrical charges used to establish a transverse electrical field for forming the channel between the drain region and the source region of the transistor have to be transported along the entire width of the gate electrode. Given the small transverse dimension (length) of the gate electrode, the electrical resistance is relatively high, which may result in higher RC-delay time-constants. Hence, generation of the transverse electrical field used to fully open the channel is delayed, thereby deteriorating the switching time of the transistor. As a consequence, the rise and fall times of the electrical signals are increased and the operating frequency, i.e., the clock frequency, is reduced. Thus, the switching time of the transistor is no longer limited by the drain and source characteristics, but rather significantly depends on the delay associated with signal propagation along the gate electrode, i.e., the transistor performance depends, at least in part, on the resistance of the gate electrode in the longitudinal direction of the gate electrode, i.e., in the gate width direction.

The reduction in the channel length of modern semiconductor devices also requires a reduction in the depth of the source and drain regions adjacent the gate electrode. This may be problematic when the source/drain regions are subjected to a salicidation process. In general, salicidation involves the process of forming a layer of refractory metal, e.g., cobalt, titanium, above a structure comprised of silicon, e.g., a polysilicon gate electrode and/or the source/drain regions of a transistor device, and, thereafter, subjecting the device to an anneal process, typically a two-step anneal process, such that a metal silicide, e.g., cobalt silicide or titanium silicide, is formed where the refractory metal is exposed to silicon. The purpose of the salicidation process is to, among other things, reduce the resistance of the components subject to the salicidation process. Thereafter, the unreacted portions of the refractory metal layer are removed. The purpose of the salicidation process is to, among other things, reduce the resistance of the components subject to the salicidation process.

However, traditional salicidation processes have become problematic with modern semiconductor devices that have shallow source/drain junctions, e.g., junction depths on the order of 1000 Å or less. In particular, during such salicidation processes, some of the existing source/drain regions are consumed. For example, when cobalt is used as the refractory metal, it consumes about twice its thickness of silicon in the process of being converted to a metal silicide, e.g., a 100 Å layer of cobalt consumes about 103 Å of silicon. Such consumption acts to reduce the dopant present in the source/drain regions and may adversely impact the electrical performance characteristics of the source/drain regions, and ultimately, the performance of the integrated circuit device. Given the fact that source/drain regions in modern semiconductor devices are already made very shallow, further reductions in the depth of these regions is undesirable.

The present invention is directed to a semiconductor device that minimizes or reduces some or all of the aforementioned problems and a method of making same.

SUMMARY OF THE INVENTION

The present invention is directed to a method of forming a semiconductor device having metal silicide regions formed thereon. In one illustrative embodiment, the method comprises forming a first layer comprised of polysilicon, forming a second layer comprised of a refractory metal above the layer of polysilicon and converting at least a portion of the second layer to a first metal silicide. The method further comprises forming an anti-reflective coating layer above the layer of refractory metal or the first metal silicide layer, and patterning the first metal silicide layer and the layer of polysilicon to define a gate stack comprised of a first metal silicide region and a layer of polysilicon. The method also comprises forming a plurality of source/drain regions in the substrate, forming a third layer comprised of a refractory metal above at least the gate stack and the source/drain regions, and converting at least a portion of the third layer to a second metal silicide region.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 2–6. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features depicted in the drawings may be exaggerated or reduced as compared to the size of those feature sizes on fabricated devices. Nevertheless, the attached drawings are included to describe and explain illustrative examples of the present invention.

In general, the present invention is directed to a method of forming metal silicide regions on a semiconductor device, and a device comprising same. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

Figure 2:
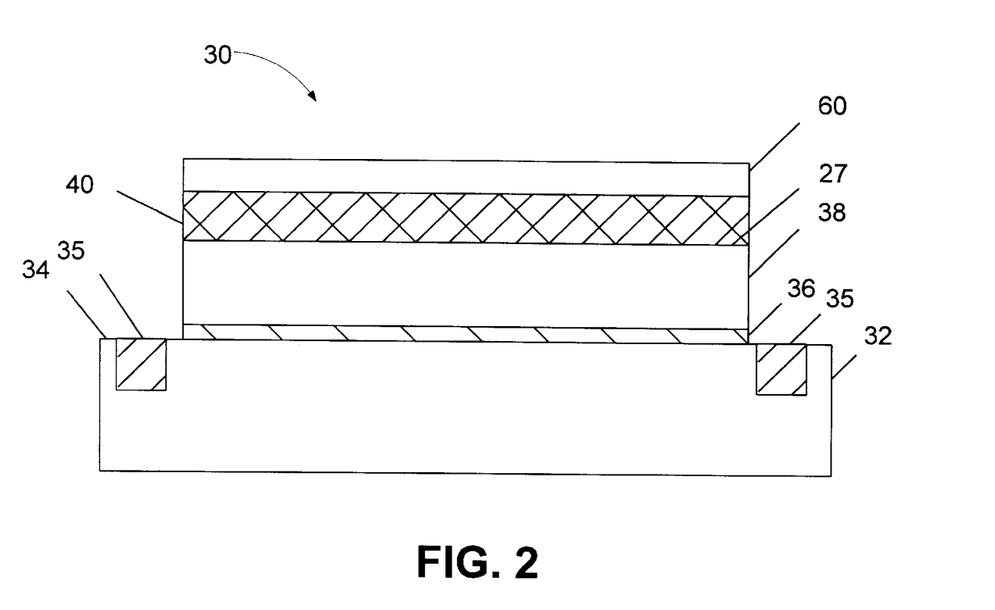
FIG. 2 is a cross-sectional view of a partially formed field effect transistor.

As shown in FIG. 2, a partially formed NMOS field effect transistor 30 is formed above a surface 34 of a semiconducting substrate 32. Although the transistor 30 depicted in FIGS. 2–6 is an NMOS transistor, the present invention is not limited to any particular technology. At this stage of fabrication, the transistor 30 is comprised of a gate dielectric layer 36, a gate electrode layer 38, a first layer of a refractory metal 40, and an anti-reflective coating ("ARC") layer 60. In general, the particular materials and techniques used to form the various layers depicted in FIG. 2, e.g., the gate dielectric layer 36 and the gate electrode layer 38, are matters of design choice, and, thus, should not be considered a limitation of the present invention. For example, the gate dielectric layer 36 may be comprised of silicon dioxide, and it may be formed by thermal growth or deposition process. Similarly, the gate electrode layer 38 may be comprised of polysilicon, and it may be formed by a physical vapor deposition ("PVD") or a chemical vapor deposition ("CVD") process. In one illustrative embodiment, the gate electrode layer 38 is comprised of a layer of polysilicon having a thickness ranging from approximately 2000–4000 Å that is formed by a CVD process.

The first layer of refractory metal 40 may be comprised of any material that may subsequently be converted to a metal silicide, e.g., cobalt, titanium, platinum, nickel, etc. The first layer of refractory metal 40 may be formed by a variety of techniques for forming such layers, e.g., PVD or CVD, and it may have a thickness ranging from approximately 100–500 Å. In one illustrative embodiment, the first layer of refractory metal 40 is comprised of a layer of titanium having a thickness ranging from approximately 100–500 Å that is made by a PVD process.

As shown in FIG. 2, the anti-reflective coating ("ARC") layer 60, if desired, may be formed above the first layer of refractory metal 40. As will be understood by those skilled in the art, the anti-reflective coating layer 60 may be useful in subsequent patterning operations. Note, however, that the anti-reflective coating layer 60 may not be required to practice the present invention. The anti-reflective coating layer 60 may be comprised of any material suitable for such purposes, e.g., titanium nitride, silicon nitride, silicon oxynitride, etc., and it may be formed by any of a variety of known techniques for forming such layers, e.g., PVD, CVD, etc. In one illustrative embodiment, the anti-reflective coating layer 60 is comprised of approximately 100–500 Å of titanium nitride that is formed by a PVD process. In the case where the first layer of refractory metal is comprised of titanium, a layer of titanium nitride may be formed by subjecting the layer of titanium to an anneal process in a nitrogen environment.

Figure 3:
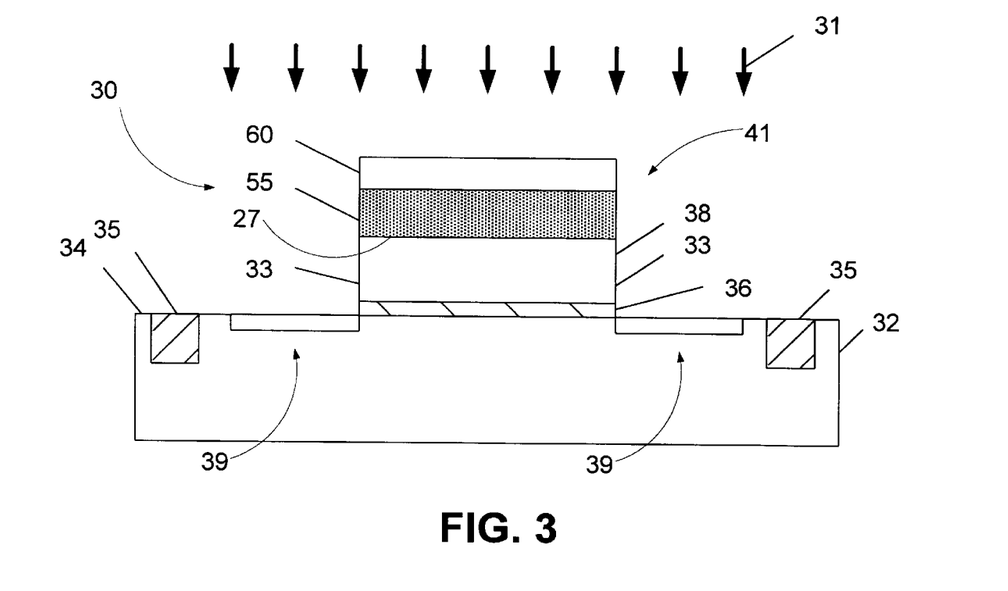
FIG. 3 is a cross-sectional view of the device in FIG. 2 after a portion of a gate stack has been formed above a semiconductor substrate.

Next, as shown in FIG. 3, a gate stack 41 comprised of a gate electrode layer 38 and a first metal silicide region 55 is formed. The gate stack 41 depicted in FIG. 3 may be formed by two different techniques. In one illustrative embodiment, the first layer of a refractory metal 40 may be converted to a metal silicide, and, thereafter, the metal silicide layer and the gate electrode layer 38 may be patterned to define the gate stack 41 depicted in FIG. 3. Alternatively, the first layer of a refractory metal 40 and the gate electrode layer 38 may be patterned, and, thereafter, the remaining portion of the first layer of a refractory metal 40 may be converted to the first metal silicide region 55, thereby resulting in the gate stack 41 depicted in FIG. 3. Irrespective of the particular technique employed, the gate stack 41, having substantially vertical sides 33, is defined using traditional photolithographic and one or more etching processes on the appropriate process layers. Note that the portions of the gate dielectric layer 36 extending beyond the sides 33 of the gate stack 41 may also be removed, although that is not necessarily required.

Using either technique, the first metal silicide region 55 may be formed by subjecting at least portions of the first layer of refractory metal 40 to an anneal process. In particular, during the anneal process, portions of the first layer of refractory metal 40 in contact with the surface 27 of the gate electrode layer 38 are converted to a first metal silicide region 55. Portions of the first refractory metal layer 40 that are unreacted after this conversion process may be removed by a subsequent acid rinse, for example, $H_2O_2$ plus water, to result in the structure depicted in FIG. 3. The anti-reflective coating layer 60, if used, may also be removed at this time. Alternatively, both the unreacted portions of the first layer of refractory metal 40, as well as the anti-reflective coating layer 60, if used, may be removed at a later stage of processing.

The particular parameters of the anneal process used to form the metal silicide region 55 are matters of design choice, and they may vary depending upon the thickness and composition of the first layer of refractory metal 40. The anneal process may be comprised of a two-step anneal processes in a rapid thermal anneal chamber. In one illustrative example, where the first layer of refractory metal 40 is comprised of approximately 150–500 Å of titanium, the anneal process may be comprised of a first step at a temperature of about 450–600° C. for a duration of approximately 10–90 seconds, and a second step at about 650–900° C. for a duration of approximately 10–90 seconds.

As indicated in FIG. 3, the transistor 30 is subjected to a light-doping ion implantation process, as indicated by arrows 31, with the appropriate dopant atoms, e.g., arsenic for NMOS technology, to form dopant implant regions 39. The regions 39 of the transistor 30 may be formed by subjecting the transistor 30 to an ion implantation process wherein the dopant concentration ranges from approximately $8 \times 10^{13}$–$2 \times 10^{15}$ ions/cm$^2$ of the appropriate dopant material and the energy level ranges from about 2–20 keV.

Figure 4:
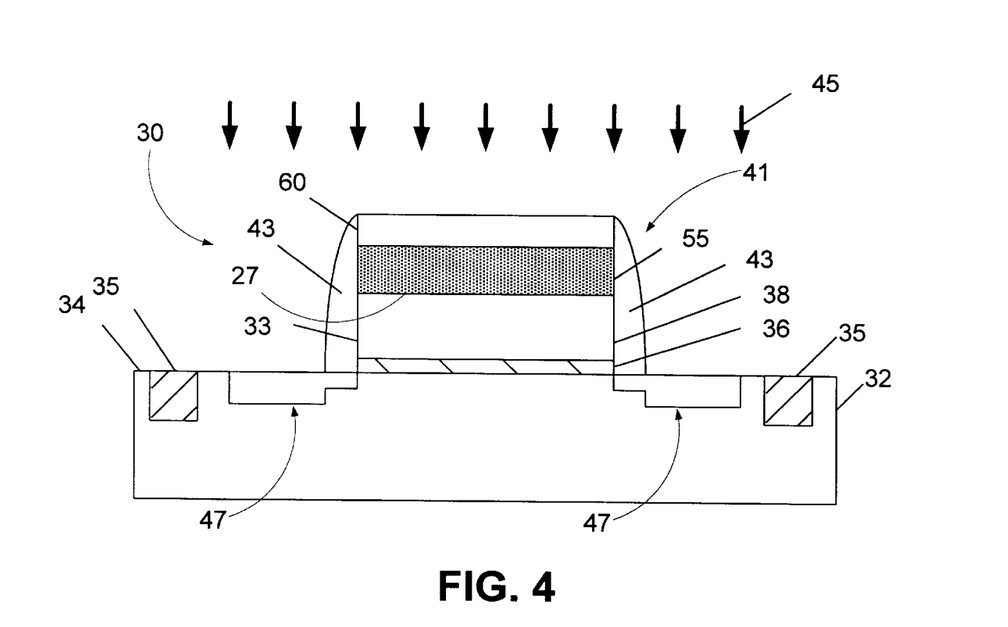
FIG. 4 is a cross-sectional view of the device depicted in FIG. 3 after a plurality of sidewall spacers have been formed adjacent the gate stack of the transistor and after an ion implantation process has been performed.

Next, as shown in FIG. 4, a plurality of sidewall spacers 43 are formed adjacent the gate stack 41. The sidewall spacers 43 may be formed by blanket-depositing a layer of spacer material (not shown) over the transistor 30, and thereafter performing an anisotropic etching process. As will be apparent to those skilled in the art upon a complete reading of the present application, the sidewall spacers 43 may be formed from any of a variety of materials, such as silicon dioxide, silicon nitride, etc. Moreover, although single sidewall spacers 43 are depicted in FIG. 4, the present invention may be used in situations where multiple sidewall spacers are formed adjacent each side 33 of the gate stack 41.

Thereafter, as shown in FIG. 4, the transistor 30 is subjected to another ion implantation process, as indicated by arrows 45, to form source/drain regions 47. The concentration of dopant atoms during this implantation process may range from about 1–$9 \times 10^{15}$ ions/cm$^2$ and the implantation energy level may be varied from about 2–40 keV. The appropriate dopant atoms are selected for the appropriate technology involved, e.g, arsenic for NMOS technology, boron for PMOS technology. Of course, the formation of source/drain regions 47 using the particular method or process described herein is not required to practice the present invention.

Figure 5:
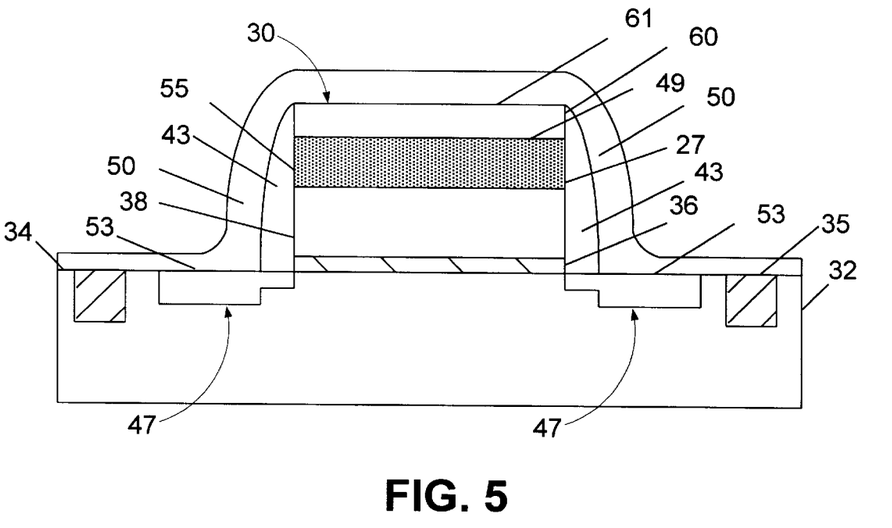
FIG. 5 is a cross-sectional view of the device shown in FIG. 4 after an additional layer of refractory metal has been formed above the device.

Next, as shown in FIG. 5, a second layer of refractory metal 50 may be formed above the gate stack 41, the sidewall spacers 43, and the surface 53 of the source/drain regions 47. The second layer of refractory metal 50 may be comprised of any metal that may subsequently be converted into a metal silicide. For example, the second layer of refractory metal 50 may be comprised of cobalt, titanium, platinum, nickel, or other like materials. The second layer of refractory metal 50 may have a thickness ranging from approximately 50–200 Å, and it may be formed by any of a variety of known techniques for forming such layers, e.g., PVD, CVD, etc. In one illustrative embodiment, the second layer of refractory metal 50 is comprised of cobalt having a thickness ranging from approximately 50–200 Å that is formed by a PVD process.

If desired, a cap layer (not shown) may also be formed above the second layer of refractory metal 50. For example, in cases where the second layer of refractory metal 50 is comprised of cobalt, a cap layer comprised of approximately 50–200 Å of titanium or titanium nitride formed by a PVD process may be used. Such a cap layer may facilitate or improve converting portions of the second layer of refractory metal 50 to a metal silicide.

Thereafter, at least a portion of the second layer of refractory metal 50 is converted to a metal silicide by performing one or more anneal processes. In particular, during the anneal process, portions of the second layer of refractory metal 50 in contact with a surface 53 of the source/drain regions 47 are converted to metal silicide regions 57 (see FIGS. 5 and 6). Portions of the second refractory metal layer 50 that are unreacted after this conversion process may be removed by a subsequent acid rinse, for example, $H_2O_2$ plus water, to result in the structure depicted in FIG. 6. Note that, portions of the anti-reflective coating layer 60, if used, and the unreacted portions of the first layer of refractory metal 40, if not already removed, may also be removed at this time. Also note that, during this salicidation process, portions of the thickness of the source/drain regions 47 are consumed.

Figure 6:
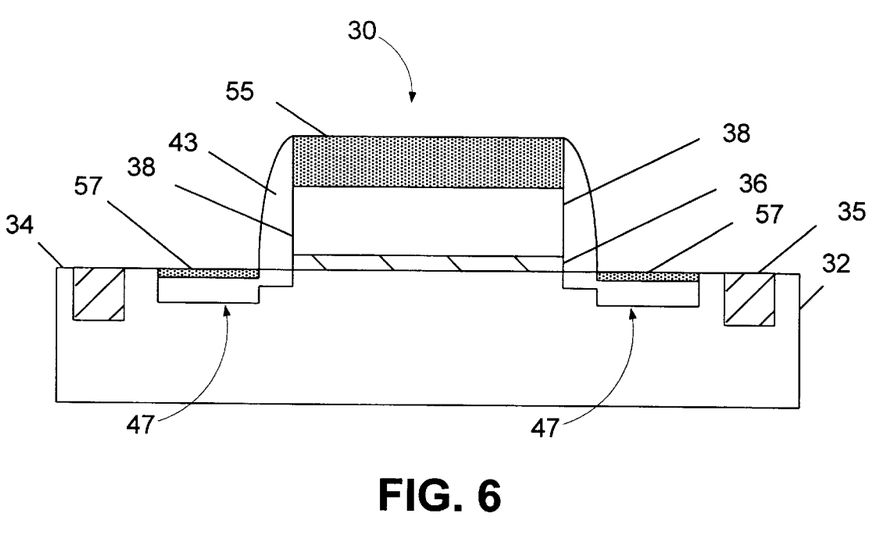
FIG. 6 is a cross-sectional view of the device shown in FIG. 5 after portions of the additional layer of refractory metal has been converted to a metal silicide region on the source/drain regions of the device.

The particular parameters of the anneal process used to form the metal silicide regions 57 are matters of design choice, and they may vary depending upon the thickness and composition of the second layer of refractory metal 50. The anneal process may be comprised of a two-step anneal processes in a rapid thermal anneal chamber. The duration and temperatures of the anneal process may be varied as a matter of design choice to insure that the second layer of refractory metal so reaches the appropriate temperature. In one illustrative example, where the second layer of refractory metal 50 is comprised of approximately 50–200 Å of cobalt, the anneal process may be comprised of a first step at about 450–600° C. for a duration of approximately 10–90 seconds, and a second step at about 650–900° C. for a duration of approximately 10–90 seconds.

As is clear from the foregoing, the first and second layers of refractory metal 40, 50 may be comprised of the same or different refractory metals. For example, the first layer of refractory metal 40 may be comprised of titanium, while the second layer of refractory metal 50 may be comprised of cobalt. Alternatively, both the first and second layers of refractory metal 40, 50 may be comprised of the same material, e.g, cobalt. Moreover, the thickness of the first and second layers of refractory metal 40, 50 may be very different.

Through use of the present invention, a transistor may be formed such that the metal silicide region 55 above the gate electrode 38 is of a different composition than that of the metal silicide region 57 formed on the source/drain regions 47. For example, the metal silicide region 55 formed above the gate electrode 38 may be comprised of titanium silicide ($TiSi_2$) while the metal silicide region 57 formed above the source/drain region 47 may be comprised of cobalt silicide ($CoSi_2$). Similarly, the metal silicide region 55 may be comprised of nickel silicide (NiSi) while the metal silicide region 57 may be comprised of cobalt silicide ($CoSi_2$).

Formation of the metal silicide regions 55, 57 from different materials may be advantageous for a number of reasons. For example, the metal silicide regions 55, 57 may be formed of different materials so as to enhance the performance of the transistor 30. That is, since the metal silicide region 55 will not be exposed to the source/drain region 47, it may be made very thick and without concern for the amount of the source/drain region 47 it would consume were the transistor fabricated using traditional silicide processing. In one illustrative embodiment, the metal silicide region 55 may be comprised of titanium silicide or nickel silicide so as to take advantage of its lower resistance as compared to that of other silicides, e.g., cobalt silicide, nickel silicide, etc. In a similar vein, the metal silicide region 57 may be made of a silicide that is less aggressive in attacking the source/drain region 47, e.g., cobalt silicide.

Moreover, in the present invention, the metal silicide regions 55 and 57 may be very different in thickness. This is advantageous in that, even if the metal silicide regions 55 and 57 are made of the same material, the metal silicide region 55 may be made much thicker than that of the metal silicide region 57 on the source/drain region 47. The resulting transistor 30 has improved electrical performance because the resistance of the gate electrode 38 is reduced, due to the increase in size of the metal silicide region 55, while the metal silicide region 57 may be made much thinner, thereby avoiding excessive consumption of the source/drain region 47.

By way of example, in the situation where the first layer of refractory metal 40 has a thickness ranging from approximately 100–500 Å, and the second layer of refractory metal 50 has a thickness ranging from approximately 50–200 Å, the metal silicide region 55 may have a thickness ranging from approximately 350–1750 Å, and the metal silicide region 57 may have a thickness ranging from approximately 175–700 Å. That is, the ratio of the thickness of the metal silicide region 55 as compared to that of the metal silicide region 57 may vary between about 2–10. This is in contrast to prior art transistors (see FIG. 1) which resulted in the metal silicide region 21 above the gate conductor 18 having a thickness that was approximately the same as the thickness of the metal silicide region 21 formed on the source/drain region 28 (see FIG. 1). A device having the above-described thickness ratios between the various silicide regions produces a transistor with enhanced electrical performance characteristics as described above.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first layer comprised of polysilicon;
    forming a second layer comprised of a refractory metal above said first layer;
    converting at least a portion of said second layer to a first metal silicide layer;
    forming a layer comprised of anti-reflective coating material above at least one of the layer of refractory metal and the first metal silicide layer;
    patterning at least said first metal silicide layer and said first layer to define a portion of a gate stack comprised of a first metal silicide region and a layer of polysilicon;
    forming a plurality of source/drain regions in said substrate;
    forming a third layer comprised of a refractory metal above at least the gate stack and said source/drain regions; and
    converting at least a portion of the third layer to a second metal silicide region.

2. The method of claim 1, further comprising forming at least one sidewall spacer adjacent said gate stack.

3. The method of claim 1, wherein forming a first layer comprised of polysilicon comprises depositing a first layer comprised of polysilicon above said first layer.

4. The method of claim 1, wherein forming a second layer comprised of a refractory metal above said first layer comprises forming a second layer comprised of at least one of cobalt, titanium, nickel, and platinum above said first layer.

5. The method of claim 1, wherein forming a second layer comprised of a refractory metal above said first layer comprises depositing a second layer comprised of a refractory metal above said first layer.

6. The method of claim 1, wherein converting at least a portion of said second layer to a first metal silicide layer comprises performing at least one anneal process to convert at least a portion of said second layer to a first metal silicide layer.

7. The method of claim 1, wherein converting at least a portion of said second layer to a first metal silicide layer comprises performing a first rapid thermal anneal process at a temperature ranging from approximately 450–600° C. for a duration ranging from approximately 10–90 seconds, and a second rapid thermal anneal process at a temperature ranging from approximately 650–900° C. for a duration ranging from approximately 10–90 seconds to convert at least a portion of said second layer to a first metal silicide layer.

8. The method of claim 1, wherein forming a layer comprised of anti-reflective coating material above at least one of the layer of refractory metal and the first metal silicide layer comprises forming a layer comprised of at least one of titanium nitride, silicon nitride, and silicon oxynitride above at least one of the layer of refractory metal and the first metal silicide layer.

9. The method of claim 1, wherein patterning at least said first metal silicide layer and said first layer to define a portion of a gate stack comprised of a first metal silicide region and a layer of polysilicon comprises etching at least said first metal silicide layer and said first layer to define a portion of a gate stack comprised of a first metal silicide region and a layer of polysilicon.

10. The method of claim 1, wherein patterning at least said first metal silicide layer and said first layer to define a portion of a gate stack comprised of a first metal silicide region and a layer of polysilicon comprises patterning at least said layer of anti-reflective coating material, said first metal silicide layer and said first layer to define a portion of a gate stack comprised of a first metal silicide region and a layer of polysilicon.

11. The method of claim 2, wherein forming at least one sidewall spacer adjacent said gate stack comprises depositing a layer of spacer material above said gate stack and performing at least one anisotropic etching process to define at least one sidewall spacer adjacent the gate stack.

12. The method of claim 1, wherein forming a third layer comprised of a refractory metal above at least the gate stack and said source/drain regions comprises forming a third layer comprised of at least one of cobalt, titanium, nickel, and platinum above at least the gate stack and said source/drain regions.

13. The method of claim 1, wherein forming a third layer comprised of a refractory metal above at least the gate stack and said source/drain regions comprises forming a third layer comprised of a refractory metal above at least the gate stack and said source/drain regions, said third layer comprised of a refractory metal that is different than the refractory metal comprising the second layer.

14. The method of claim 1, wherein forming a third layer comprised of a refractory metal above at least the gate stack and said source/drain regions comprises forming a third layer comprised of a refractory metal above at least the gate stack and said source/drain regions, said third layer comprised of a refractory metal that is the same as the refractory metal comprising the second layer.

15. The method of claim 1, wherein converting at least a portion of the third layer to a second metal silicide region comprises performing at least one anneal process to convert at least a portion of the third layer to a second metal silicide region.

16. The method of claim 1, wherein converting at least a portion of the third layer to a second metal silicide region comprises performing a first rapid thermal anneal process at a temperature ranging from approximately 450–600° C. for a duration ranging from approximately 10–90 seconds, and a second rapid thermal anneal process at a temperature ranging from approximately 650–900° C. for a duration ranging from approximately 10–90 seconds to convert at least a portion of the third layer to a second metal silicide region.

17. The method of claim 1, wherein converting at least a portion of said third layer to a second metal silicide region comprises converting at least a portion of the third layer to a second metal silicide region, said first and second metal silicide regions being of the same composition.

18. The method of claim 1, wherein converting at least a portion of the third layer to a second metal silicide region comprises converting at least a portion of the third layer to a second metal silicide region, said first and second metal silicide regions being of a different composition.

19. The method of claim 1, wherein converting at least a portion of the third layer to a second metal silicide region comprises converting at least a portion of the third layer to a second metal silicide region, said first metal silicide region having a thickness, said second metal silicide region having a thickness, the thickness of said first metal silicide region being approximately 2–10 times as thick as the thickness of said second metal silicide region.

20. The method of claim 1, wherein converting at least a portion of the third layer to a second metal silicide region occurs after said conversion of a portion of said second layer to a first metal silicide layer.

21. The method of claim 1, wherein forming a third layer comprised of a refractory metal above at least the gate stack and said source/drain regions occurs after said conversion of a portion of said second layer to a first metal silicide layer.

22. A method, comprising:
depositing a first layer comprised of polysilicon;
depositing a second layer comprised of a refractory metal above said first layer;
converting at least a portion of said second layer to a first metal silicide layer;
depositing a layer comprised of at least one of titanium nitride, silicon nitride, and silicon oxynitride above at least the layer of refractory metal and the first metal silicide layer;
etching at least said first metal silicide layer and said first layer to define a portion of a gate stack comprised of a first metal silicide region and a layer of polysilicon;
forming a plurality of source/drain regions in said substrate;
depositing a third layer comprised of a refractory metal above at least the gate stack and said source/drain regions; and
converting at least a portion of the third layer to a second metal silicide region.

23. The method of claim 22, further comprising forming at least one sidewall spacer adjacent said gate stack.

24. The method of claim 22, wherein forming a second layer comprised of a refractory metal above said first layer comprises forming a second layer comprised of at least one of cobalt, titanium, nickel, and platinum above said first layer.

25. The method of claim 22, wherein converting at least a portion of said second layer to a first metal silicide layer comprises performing at least one anneal process to convert at least a portion of said second layer to a first metal silicide layer.

26. The method of claim 22, wherein converting at least a portion of said second layer to a first metal silicide layer comprises performing a first rapid thermal anneal process at a temperature ranging from approximately 450–600° C. for a duration ranging from approximately 10–90 seconds, and a second rapid thermal anneal process at a temperature ranging from approximately 650–900° C. for a duration ranging from approximately 10–90 seconds to convert at least a portion of said second layer to a first metal silicide layer.

27. The method of claim 22, wherein etching at least said first metal silicide layer and said first layer to define a portion of a gate stack comprised of a first metal silicide region and a layer of polysilicon comprises etching at least said anti-reflective coating layer, said first metal silicide layer and said first layer to define a portion of a gate stack comprised of a first metal silicide region and a layer of polysilicon.

28. The method of claim 23, wherein forming at least one sidewall spacer adjacent said gate stack comprises depositing a layer of spacer material above said gate stack and performing at least one anisotropic etching process to define at least one sidewall spacer adjacent the gate stack.

29. The method of claim 22, wherein forming a third layer comprised of a refractory metal above at least the gate stack and said source/drain regions comprises forming a third layer comprised of at least one of cobalt, titanium, nickel, and platinum above at least the gate stack and said source/drain regions.

30. The method of claim 22, wherein forming a third layer comprised of a refractory metal above at least the gate stack and said source/drain regions comprises forming a third layer comprised of a refractory metal above at least the gate stack and said source/drain regions, said third layer comprised of a refractory metal that is different than the refractory metal comprising the second layer.

31. The method of claim 22, wherein forming a third layer comprised of a refractory metal above at least the gate stack and said source/drain regions comprises forming a third layer comprised of a refractory metal above at least the gate stack and said source/drain regions, said third layer comprised of a refractory metal that is the same as the refractory metal comprising the second layer.

32. The method of claim 22, wherein converting at least a portion of the third layer to a second metal silicide region comprises performing at least one anneal process to convert at least a portion of the third layer to a second metal silicide region.

33. The method of claim 22, wherein converting at least a portion of the third layer to a second metal silicide region comprises performing a first rapid thermal anneal process at a temperature ranging from approximately 450–600° C. for a duration ranging from approximately 10–90 seconds, and a second rapid thermal anneal process at a temperature ranging from approximately 650–900° C. for a duration ranging from approximately 10–90 seconds to convert at least a portion of the third layer to a second metal silicide region.

34. The method of claim 22, wherein converting at least a portion of said third layer to a second metal silicide region comprises converting at least a portion of the third layer to a second metal silicide region, said first and second metal silicide regions being of the same composition.

35. The method of claim 22, wherein converting at least a portion of said third layer to a second metal silicide region comprises converting at least a portion of the third layer to a second metal silicide region, said first and second metal silicide regions being of a different composition.

36. The method of claim 22, wherein converting at least a portion of the third layer to a second metal silicide region comprises converting at least a portion of the third layer to a second metal silicide region, said first metal silicide region having a thickness, said second metal silicide region having a thickness, the thickness of said first metal silicide region being approximately 2–10 times as thick as the thickness of said second metal silicide region.

37. The method of claim 22, wherein converting at least a portion of the third layer to a second metal silicide region occurs after said conversion of a portion of said second layer to a first metal silicide layer.

38. The method of claim 22, wherein forming a third layer comprised of a refractory metal above at least the gate stack and said source/drain regions occurs after said conversion of a portion of said second layer to a first metal silicide layer.

39. A method, comprising:
  depositing a first layer comprised of polysilicon;
  depositing a second layer comprised of titanium above said first layer;
  converting at least a portion of said second layer to a first metal silicide layer comprised of titanium silicide;
  depositing a layer of titanium nitride above at least one of the second layer and the first metal silicide layer;
  etching at least said first metal silicide layer and said first layer to define a portion of a gate stack comprised of a first metal silicide region comprised of titanium silicide and a layer of polysilicon;
  forming a plurality of source/drain regions in said substrate;
  depositing a third layer comprised of a refractory metal above at least the gate stack and said source/drain regions; and
  converting at least a portion of the third layer to a second metal silicide region.

40. The method of claim 39, further comprising forming at least one sidewall spacer adjacent said gate stack.

41. The method of claim 39, wherein converting at least a portion of said second layer to a first metal silicide layer comprises performing at least one anneal process to convert at least a portion of said second layer to a first metal silicide layer.

42. The method of claim 39, wherein converting at least a portion of said second layer to a first metal silicide layer comprises performing a first rapid thermal anneal process at a temperature ranging from approximately 450–600° C. for a duration ranging from approximately 10–90 seconds, and a second rapid thermal anneal process at a temperature ranging from approximately 650–900° C. for a duration ranging from approximately 10–90 seconds to convert at least a portion of said second layer to a first metal silicide layer.

43. The method of claim 39, wherein etching at least said first metal silicide layer and said first layer to define a portion of a gate stack comprised of a first metal silicide region and a layer of polysilicon comprises etching at least said layer of titanium nitride, said first metal silicide layer and said first layer to define a portion of a gate stack comprised of a first metal silicide region and a layer of polysilicon.

44. The method of claim 40, wherein forming at least one sidewall spacer adjacent said gate stack comprises depositing a layer of spacer material above said gate stack and performing at least one anisotropic etching process to define at least one sidewall spacer adjacent the gate stack.

45. The method of claim 39, wherein depositing a third layer comprised of a refractory metal above at least the gate stack and said source/drain regions comprises depositing a third layer comprised of at least one of cobalt, titanium, nickel, and platinum above at least the gate stack and said source/drain regions.

46. The method of claim 39, wherein depositing a third layer comprised of a refractory metal above at least the gate stack and said source/drain regions comprises depositing a third layer comprised of a refractory metal above at least the gate stack and said source/drain regions, said third layer comprised of a refractory metal that is different than the refractory metal comprising the second layer.

47. The method of claim 39, wherein depositing a third layer comprised of a refractory metal above at least the gate stack and said source/drain regions comprises depositing a third layer comprised of a refractory metal above at least the gate stack and said source/drain regions, said third layer comprised of a refractory metal that is the same as the refractory metal comprising the second layer.

48. The method of claim 39, wherein converting at least a portion of the third layer to a second metal silicide region comprises performing at least one anneal process to convert at least a portion of the third layer to a second metal silicide region.

49. The method of claim 39, wherein converting at least a portion of the third layer to a second metal silicide region comprises performing a first rapid thermal anneal process at a temperature ranging from approximately 450–600° C. for a duration ranging from approximately 10–90 seconds, and a second rapid thermal anneal process at a temperature ranging from approximately 650–900° C. for a duration ranging from approximately 10–90 seconds to convert at least a portion of the third layer to a second metal silicide region.

50. The method of claim 39, wherein converting at least a portion of said third layer to a second metal silicide region comprises converting at least a portion of the third layer to a second metal silicide region, said first and second metal silicide regions being of the same composition.

51. The method of claim 39, wherein converting at least a portion of said third layer to a second metal silicide region comprises converting at least a portion of the third layer to a second metal silicide region, said first and second metal silicide regions being of a different composition.

52. The method of claim 39, wherein converting at least a portion of the third layer to a second metal silicide region comprises converting at least a portion of the third layer to a second metal silicide region, said first metal silicide region having a thickness, said second metal silicide region having a thickness, the thickness of said first metal silicide region being approximately 2–10 times as thick as the thickness of said second metal silicide region.

53. The method of claim 39, wherein converting at least a portion of the third layer to a second metal silicide region occurs after said conversion of a portion of said second layer to a first metal silicide layer.

54. The method of claim 39, wherein depositing a third layer comprised of a refractory metal above at least the gate stack and said source/drain regions occurs after said conversion of a portion of said second layer to a first metal silicide layer.

55. A method, comprising:

forming a first layer comprised of polysilicon;

forming a second layer comprised of a refractory metal above said first layer;

forming a layer comprised of anti-reflective coating material above the layer of refractory metal;

converting at least a portion of said second layer to a first metal silicide layer;

patterning at least said first metal silicide layer and said first layer to define a portion of a gate stack comprised of a first metal silicide region and a layer of polysilicon;

forming a plurality of source/drain regions in said substrate;

forming a third layer comprised of a refractory metal above at least the gate stack and said source/drain regions; and converting at least a portion of the third layer to a second metal silicide region.

56. A method, comprising:

forming a first layer comprised of polysilicon;

forming a second layer comprised of a refractory metal above said first layer;

converting at least a portion of said second layer to a first metal silicide layer;

forming a layer comprised of anti-reflective coating material above the first metal silicide layer;

patterning at least said first metal silicide layer and said first layer to define a portion of a gate stack comprised of a first metal silicide region and a layer of polysilicon;

forming a plurality of source/drain regions in said substrate;

forming a third layer comprised of a refractory metal above at least the gate stack and said source/drain regions; and converting at least a portion of the third layer to a second metal silicide region.

* * * * *